(12) United States Patent
Kuster et al.

(10) Patent No.: US 8,763,346 B2
(45) Date of Patent: Jul. 1, 2014

(54) SOLAR MODULE ATTACHMENT DEVICE AND MOUNTING METHOD

(75) Inventors: Hans-Werner Kuster, Aachen (DE); Felix Kuster, Aachen (DE)

(73) Assignee: Saint-Gobain Glass France, Courbevoie (FR)

( * ) Notice: Subject to any disclaimer, the term of this patent is extended or adjusted under 35 U.S.C. 154(b) by 50 days.

(21) Appl. No.: 13/319,894

(22) PCT Filed: May 12, 2010

(86) PCT No.: PCT/FR2010/050922
§ 371 (c)(1),
(2), (4) Date: Dec. 29, 2011

(87) PCT Pub. No.: WO2010/130952
PCT Pub. Date: Nov. 18, 2010

(65) Prior Publication Data
US 2012/0085395 A1   Apr. 12, 2012

(30) Foreign Application Priority Data
May 12, 2009   (FR) ...................................... 09 53119

(51) Int. Cl.
*E04B 1/00*   (2006.01)

(52) U.S. Cl.
USPC ........... 52/747.1; 52/173.3; 52/710; 126/621; 136/244

(58) Field of Classification Search
USPC .......... 52/173.3, 710, 711, 511, 489.1, 747.1; 248/200, 226.11, 227.4, 228.1, 227.2, 248/121, 122.2; 126/621, 622, 623; 136/244, 251, 291
See application file for complete search history.

(56) References Cited

U.S. PATENT DOCUMENTS

| 4,254,813 A | | 3/1981 | Vecchiarelli |
| 4,677,248 A | * | 6/1987 | Lacey ............................ 136/244 |
| 5,876,084 A | * | 3/1999 | Smith et al. ................... 296/39.1 |
| 6,296,596 B1 | * | 10/2001 | Alessandri et al. ........... 482/100 |
| 6,370,828 B1 | | 4/2002 | Genschorek |
| 6,672,018 B2 | * | 1/2004 | Shingleton .................... 52/173.3 |

(Continued)

FOREIGN PATENT DOCUMENTS

| DE | 20 2006 018 426 | 3/2007 |
| DE | 20 2007 003 060 | 8/2008 |

(Continued)

OTHER PUBLICATIONS

International Search Report Issued Nov. 11, 2011 in PCT/FR10/050922 Filed May 12, 2010.

*Primary Examiner* — William Gilbert
*Assistant Examiner* — Gisele Ford
(74) *Attorney, Agent, or Firm* — Oblon, Spivak, McClelland, Maier & Neustadt, L.L.P.

(57) ABSTRACT

An attachment device for a module for collecting energy originating from solar radiation to a structure, such as a roof, a façade, or a mounting structure of a ground-mounted structure, wherein the module includes on its rear face at least one reinforcing profiled section. The attachment device includes at least one support secured to the structure. The support includes a snap-fastening mechanism with respect to the reinforcing profiled section of the module, which snap-fastening mechanism can be activated by applying a one-way thrust force pushing the module in the direction of the structure.

19 Claims, 4 Drawing Sheets

(56) References Cited

U.S. PATENT DOCUMENTS

| | | | |
|---|---|---|---|
| 7,407,961 B2 * | 8/2008 | Yonishi et al. | 514/255.05 |
| 7,420,177 B2 * | 9/2008 | Williams et al. | 250/370.08 |
| 8,104,239 B2 * | 1/2012 | Fath | 52/173.3 |
| 8,240,109 B2 * | 8/2012 | Cusson et al. | 52/745.05 |
| 8,250,829 B2 * | 8/2012 | McPheeters et al. | 52/710 |
| 8,272,177 B2 * | 9/2012 | Jousse et al. | 52/173.3 |
| 8,341,900 B2 * | 1/2013 | Reyal et al. | 52/235 |
| 8,397,448 B2 * | 3/2013 | Brown et al. | 52/173.3 |
| 8,407,895 B2 * | 4/2013 | Hartelius et al. | 29/890.033 |
| 2010/0237029 A1 * | 9/2010 | Cusson et al. | 211/41.1 |
| 2011/0079694 A1 * | 4/2011 | Hartelius et al. | 248/229.26 |
| 2011/0174353 A1 | 7/2011 | Urban et al. | |

FOREIGN PATENT DOCUMENTS

| | | |
|---|---|---|
| DE | 20 2008 015 237 | 3/2009 |
| EP | 1 070 923 | 1/2001 |
| WO | 00 12839 | 3/2000 |

* cited by examiner

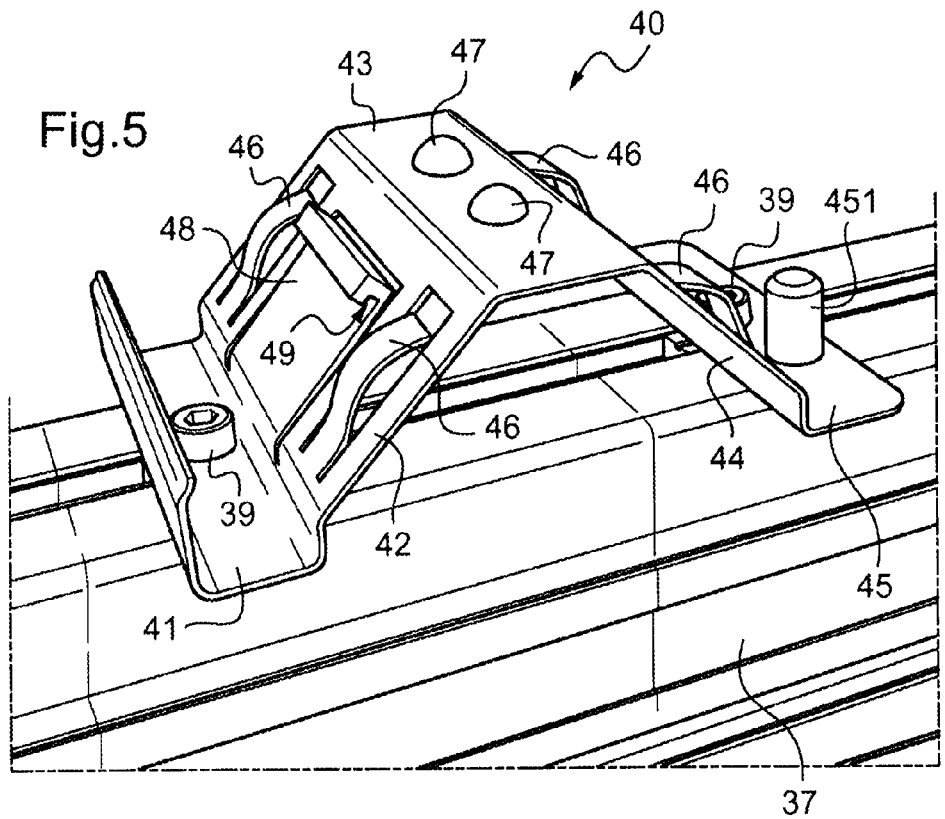
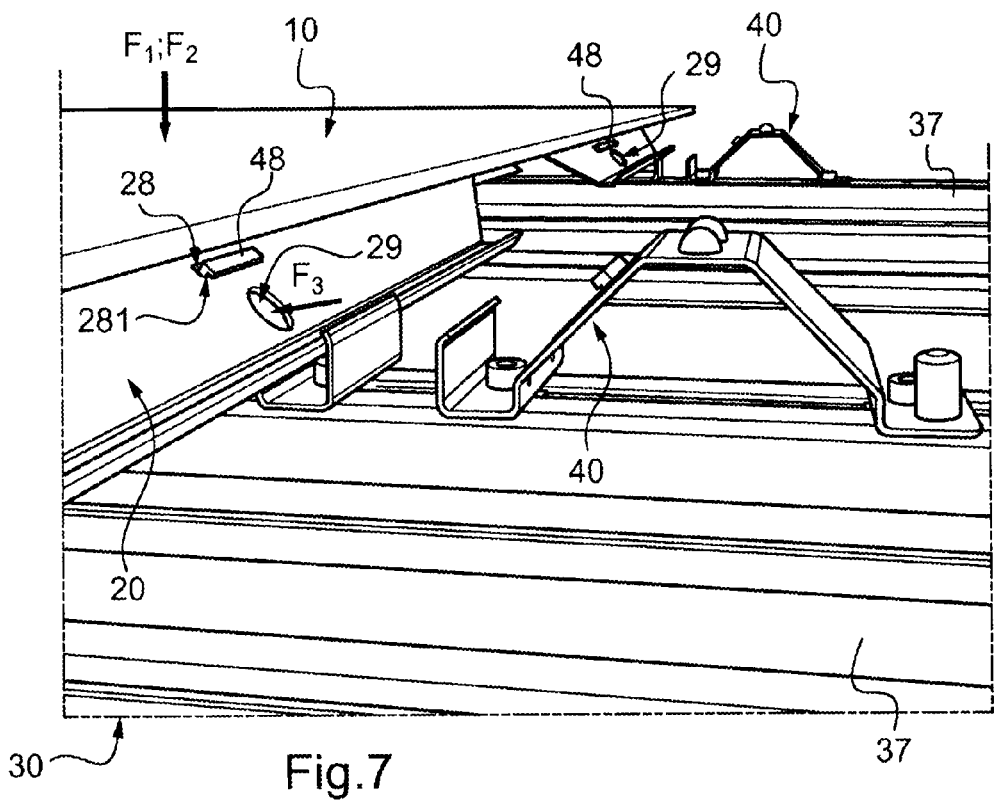

SOLAR MODULE ATTACHMENT DEVICE AND MOUNTING METHOD

The present application is the U.S. counterpart of WO 2010/130952, and claims priority to French application no. 0953119 filed May 12, 2009, the entire contents of each of which are hereby incorporated herein by reference.

BACKGROUND

The present invention relates to a device for attaching a module for collecting energy originating from solar radiation to a structure, such as a roof, a façade or a mounting structure of a ground-mounted system, and to a method for mounting at least one module for collecting energy originating from solar radiation on a structure.

Within the meaning of the invention, a module for collecting energy originating from solar radiation may, in particular, be a photovoltaic solar module capable of converting the energy originating from solar radiation into electrical energy; a thermal solar module capable of converting the energy originating from solar radiation into thermal energy collected in a heat transfer fluid; or alternatively, a hybrid solar module using both these types of energy conversion.

In a known manner, a photovoltaic solar module takes the form of a laminated glazing unit comprising photovoltaic cells inserted between a transparent front substrate intended to be positioned on the side of incidence of the solar radiation on the module, and a transparent or opaque rear substrate intended to be positioned facing a structure for mounting the module. The front and rear substrates may in particular be formed by sheets of glass or of thermoplastic polymer. In order to allow the mounting of the photovoltaic module onto a structure, such as a roof or a façade of a building, or alternatively a mounting structure of a ground-mounted system, the module is conventionally equipped with a metal frame, particularly made of aluminium, which covers its periphery. The attachment of the module to the mounting structure is then achieved by securing the frame to the structure and/or to the frame of another module, if several juxtaposed modules are mounted.

The frame of each module is generally secured to the mounting structure and, as appropriate, to the frames of adjacent modules, by screwing or bolting. This results in a relatively long time for mounting the photovoltaic modules on the structure, and in a relatively long removal time in the event of a failure of one or more modules. Moreover, the presence of a metal frame on the periphery of each module and the attachment of the module to the structure at this frame cause mechanical stresses to occur on the periphery of the module, which harms the mechanical strength of the module. In addition, the metal frame of each module covers active surface portions on the periphery of the module which, if they were not covered, would participate in the energy conversion, which limits the efficiency of the module.

Similar problems arise with thermal or hybrid photovoltaic/thermal solar modules.

BRIEF SUMMARY

It is these disadvantages that the invention particularly seeks to remedy by proposing an attachment device allowing the rapid and reliable mounting of solar modules on a receiving structure, without weakening the structure of the modules, and easy replacement of the modules once mounted on a structure, for example in the event of a failure.

To this end, a subject of the invention is a device for attaching at least one module for collecting energy originating from solar radiation on a structure, such as a roof, a façade or a mounting structure of a ground-mounted system, in which the module is provided on its rear face with at least one reinforcing profiled section, characterized in that it comprises at least one support secured to the structure, this support comprising snap-fastening means with respect to the reinforcing profiled section of the module, which snap-fastening means can be activated by applying a one-way thrust force pushing the module toward the structure.

Within the meaning of the invention, the rear face of the module is that face of the module which is positioned facing the structure when the module is fixed to the structure.

According to other advantageous features of an attachment device according to the invention, considered in isolation or in any technically feasible combination:

- the support comprises, for locking the snap-fastening means in their activated state, elastic means for pushing the module away from the structure;
- the snap-fastening means comprise at least one tongue of the support able to collaborate by snap-fastening with a notch of the reinforcing profiled section of the module;
- the tongue defines a groove for accommodating an edge of the notch, this groove being open toward the structure;
- the device comprises, as locking means for locking the snap-fastening means in their activated state, elastic thrust means for pushing the module away from the structure so as to keep the edge of the notch inside the groove;
- the reinforcing profiled section comprises an unlocking orifice which, when the snap-fastening means are in the activated state, faces the tongue, the snap-fastening means being able to change from the activated state to a deactivated state under the combined effect of a thrust force pushing the module toward the structure against the action of the elastic means and of a thrust force pushing the tongue away from the notch and applied through the unlocking orifice;
- the reinforcing profiled section comprises at least one part with a U-shaped cross section substantially complementing the U-shaped cross section of a part of the support, these U-shaped parts being engaged in one another when the snap-fastening means are in the activated state;
- the device comprises at least one peg secured to one of either the reinforcing profiled section or the support, this peg being able to collaborate with an orifice in the other of either the reinforcing profiled section or the support in order to align the snap-fastening means of the support with respect to the reinforcing profiled section;
- the support is a metal blank which has been cut and bent to form the snap-fastening means;
- the reinforcing profiled section is inwardly offset with respect to the peripheral edges of the module;
- the reinforcing profiled section is of elongate shape and designed to collaborate by snap-fastening with a support at each of its ends;
- the device comprises at least two reinforcing profiled sections secured to said face of the module and evenly distributed over said face of the module;
- the module is a frameless photovoltaic module, which comprises a front substrate, a rear substrate and at least one photovoltaic cell inserted between the front and rear substrates, the or each reinforcing profiled section being secured to a rear face of the rear substrate which is the opposite face to the photovoltaic cell.

Another subject of the invention is a method for mounting at least one module for collecting energy originating from solar radiation on a structure, such as a roof, a façade or a mounting structure of a ground-mounted system, in which the module is provided on its rear face with at least one reinforcing profiled section, by means of an attachment device as described hereinabove and comprising steps in which:

at least one support is secured to the structure;

alignment of the snap-fastening means of the support with respect to the reinforcing profiled section is obtained;

the snap-fastening means are activated by applying a one-way thrust force pushing the module toward the structure.

BRIEF DESCRIPTION OF THE DRAWINGS

The features and advantages of the invention will become apparent from the following description of one embodiment of an attachment device and of a mounting method according to the invention, which is given solely by way of example and made with reference to the attached drawings in which:

FIG. 5 is a view on a larger scale of detail V of FIG. 2;

FIG. 7 is a perspective view in the direction of arrow VII of FIG. 2.

DETAILED DESCRIPTION

Figure 1:
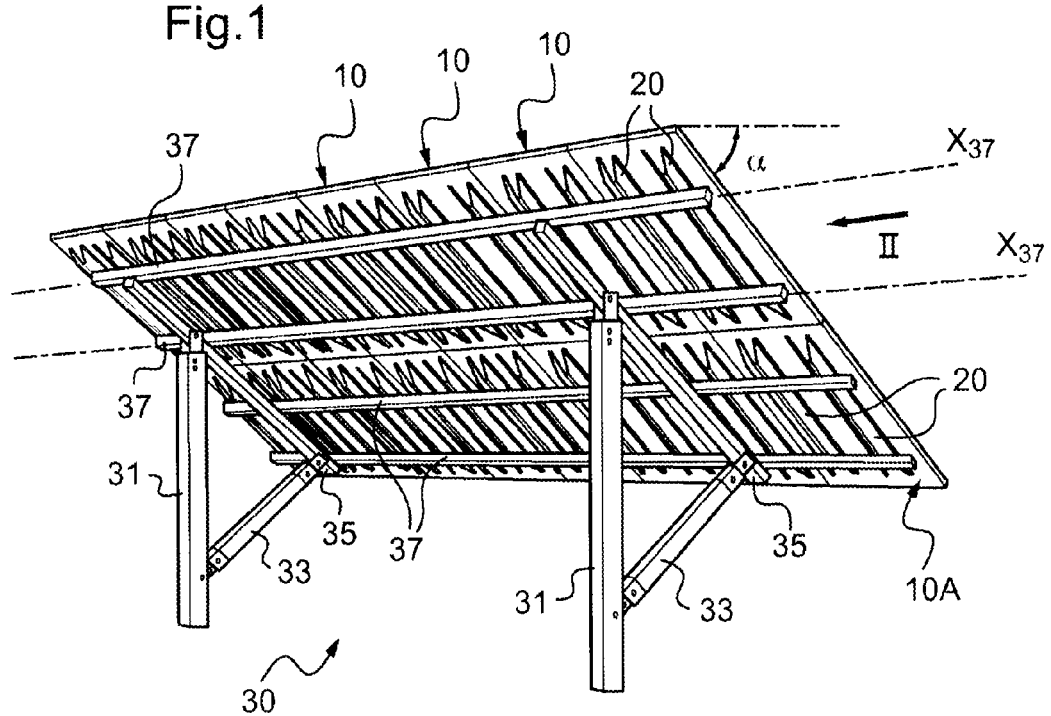
FIG. 1 is a perspective view of photovoltaic solar modules mounted on a mounting structure by means of an attachment device according to the invention.

FIG. 1 depicts photovoltaic modules 10 mounted on a mounting structure 30 of a ground-mounted system. The structure 30 is designed to receive the modules 10 with each module inclined by an angle α with respect to the horizontal, this inclination being designed to maximize the amount of solar radiation incident upon the module. In FIG. 1, the elements involved in connecting and carrying electrical current have been omitted to make the drawing clearer. The structure 30 is a stainless steel structure comprising a plurality of beams 31, 33, arranged relative to one another so as to form a triangulate framework, on which crossmembers 37 are attached. The crossmembers 37, of which a longitudinal axis is denoted $X_{37}$, are parallel to one another and intended to receive a plurality of juxtaposed photovoltaic modules 10, each photovoltaic module 10 being mounted on the structure 30 by means of an attachment device 1 according to the invention. In the example depicted in the figures, each module 10 is provided on its rear face 10A with two reinforcing profiled sections 20 and the attachment device 1 comprises, for each module 10, four supports 40 secured to the structure.

Figure 3:
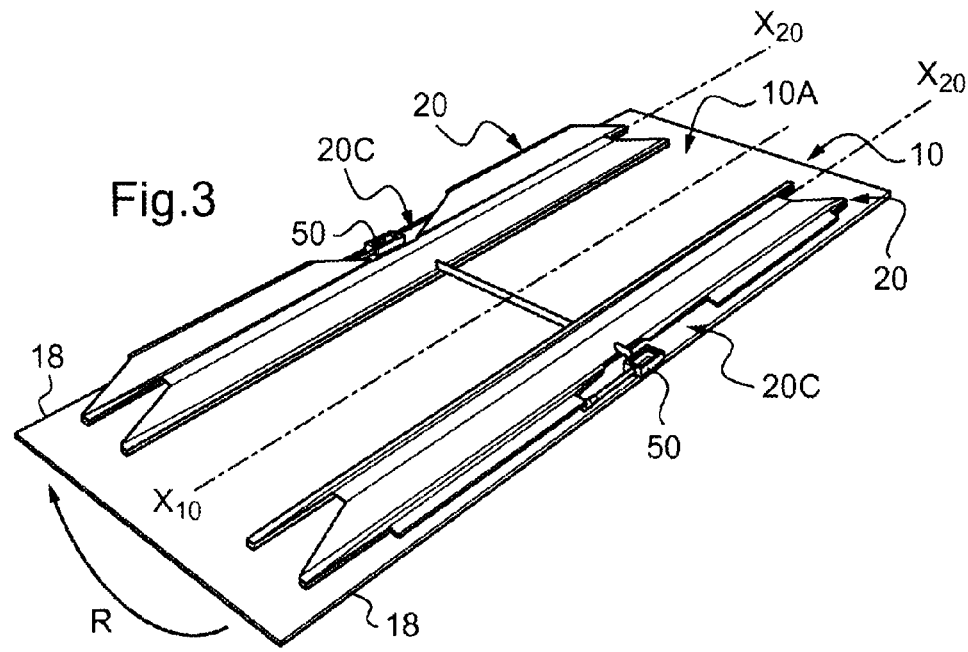
FIG. 3 is a perspective view from beneath of a photovoltaic module of FIG. 2 fitted with reinforcing profiled sections.
Figure 4:
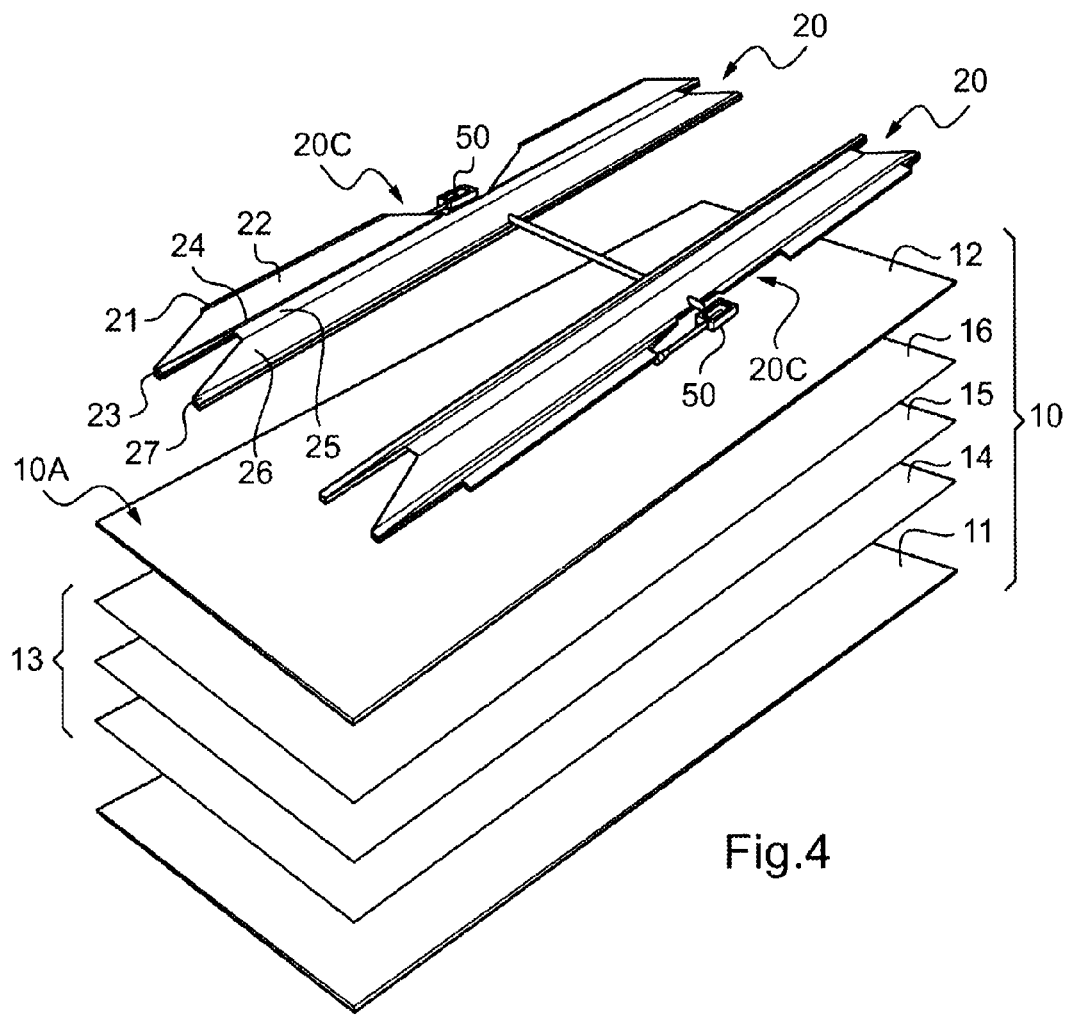
FIG. 4 is a view similar to FIG. 3, but in exploded perspective.

As shown in FIGS. 3 and 4, each module 10 of this embodiment is a frameless photovoltaic module, which comprises a front substrate 11, a rear substrate 12, and one or more photovoltaic cells 13 inserted between the front 11 and rear 12 substrates. The front substrate 11, intended to be positioned on the side of incidence of the solar radiation on the module 10, is transparent, for example made of an extra-clear transparent glass or of a transparent thermoplastic polymer such as polycarbonate, polyurethane or polymethyl methacrylate. The rear substrate 12, intended to be positioned facing the structure 30, is made of any appropriate material, which may be transparent or non-transparent, particularly glass.

The or each photovoltaic cell 13 positioned between the substrates 11 and 12 is formed by a stack of thin layers comprising, in succession, starting from the front substrate 11, an electrically conducting transparent layer 14, notably one based on a Transparent Conductive Oxide (TCO) which forms a front electrode of the cell; an absorber layer 15, capable of converting the energy originating from the solar radiation incident upon the cell into electrical energy, notably a thin layer based on amorphous or microcrystalline silicon, or based on cadmium telluride; and an electrically conducting layer 16 which forms a rear electrode of the cell.

As an alternative, the absorber layer 15 of the or each cell 13 may be a thin layer of chalcopyrite compound containing copper, indium and selenium, known as a CIS absorber layer, possibly with the addition of gallium (CIGS absorber layer), aluminium or sulphur. In this case, the or each thin layer cell 13 comprises a stack analogous to the one described hereinabove, a polymer encapsulant, not depicted, also being positioned between the front electrode 14 of the cell and the front substrate 11, to ensure good cohesion of the module 10 when it is being assembled. The encapsulant may in particular be made of polyvinyl butyral (PVB) or ethylene vinyl acetate (EVA).

According to yet another alternative, the or each cell 13 may be made up of polycrystalline or monocrystalline silicon wafers forming a p/n junction.

Figure 2:
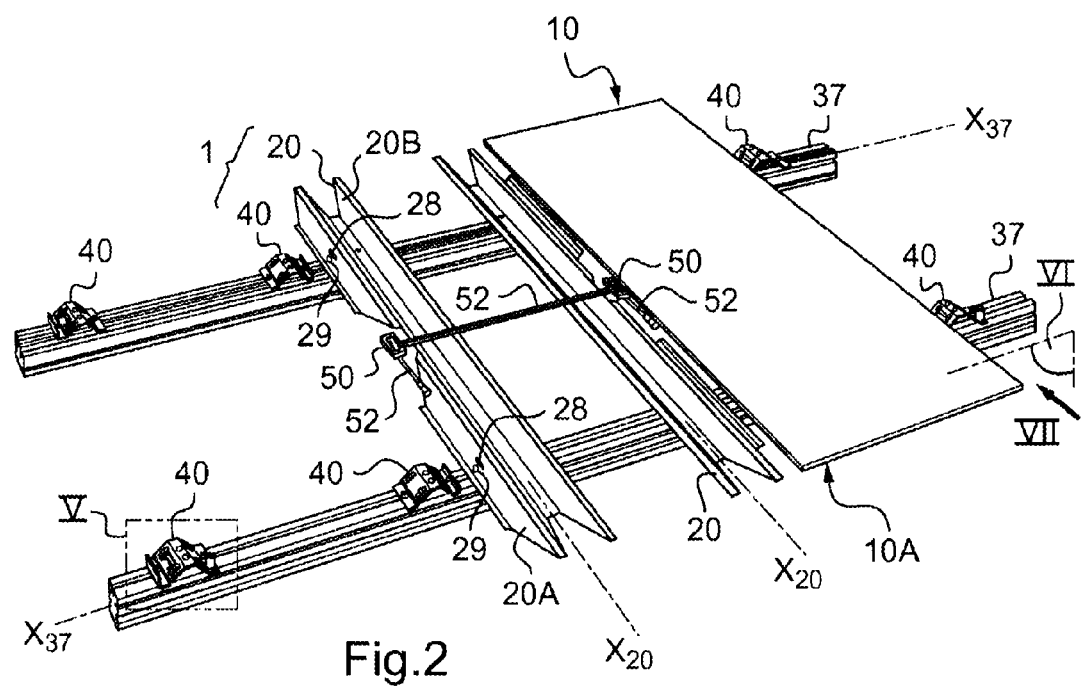
FIG. 2 is a partial perspective view in the direction of arrow II of FIG. 1, with two photovoltaic modules mounted on the mounting structure, one of the modules being shown transparent in order to reveal its reinforcing profiled sections.

As may be seen in FIG. 2, each module 10 comprises two reinforcing profiled sections 20 secured to its rear face 10A intended to be facing the structure 30, which is the face of the rear substrate 12 opposite to the or each photovoltaic cell 13. Each reinforcing profiled section 20 is of elongate shape with a longitudinal axis $X_{20}$ and is designed to collaborate by snap-fastening with a support 40 at each of its ends 20A and 20B. The four supports 40 that receive a module are distributed in pairs over two adjacent crossmembers 37 such that in the configuration in which the two profiled sections 20 of the module are snap-fastened onto the corresponding four supports 40, the longitudinal axis $X_{20}$ of each profiled section 20 is directed transversally with respect to the axis $X_{37}$ of the crossmembers 37. When each of the two reinforcing profiled sections 20 of a module 10 is collaborating by snap-fastening with two supports 40, the module 10 is immobilized with respect to the structure 30.

Advantageously, as shown in FIG. 3, the two reinforcing profiled sections 20 of each module 10 are arranged on the rear face 10A of the module with their longitudinal axes $X_{20}$ parallel to each other and to two opposite peripheral edges 18 of the module, such that, when the module 10 is mounted on the structure 30, the profiled sections 20 run perpendicular to the crossmembers 37. Such an arrangement encourages convective air movements at the rear of the module 10, and therefore promotes the cooling of the module. For preference, each profiled section 20 is inwardly offset with respect to the corresponding lateral edge 18 of the module 10, so as to reinforce the structure of the module and improve its mechanical strength.

In this embodiment, each reinforcing profiled section 20 of a module 10 is made of stainless steel and formed of a single cut and bent blank. Each profiled section has a cross section in the overall shape of two omegas nested inside one another. More specifically, each omega 21-25 or 23-27 comprises two branches 21, 25 or 23, 27 flanking a central part 22-24 or 24-26 of the omega. Each central part 22-24 or 24-26 comprises a bottom wall and two lateral walls that are oblique with respect to the bottom wall, the two omegas being nested together in such a way that the bottom wall 23 or 25 of the central part of one omega forms a branch of the other omega. The walls 21, 23, 25 and 27 of the profiled section 20, which form the bottom walls and the branches of the omegas, are substantially flat and are intended respectively to face the rear face 10A of the module 10, in the case of the walls 23 and 27, and the structure 30, in the case of the walls 21 and 25.

The two reinforcing profiled sections 20 of each module are secured directly to the rear face 10A of the module by bonding the walls 23 and 27 against the face 10A using an adhesive material. As may be seen in FIGS. 3 and 4, the walls 21 and 22 of each profiled section 20 delimit a cutout 20C in a central portion of the profiled section with respect to its longitudinal direction. This cutout 20C is obtained by cutting the blank of which the profiled section 20 is made, before this blank is bent. The cutout 20C of each profiled section 20 creates a recess such that a junction box 50 can be fitted on the rear face 10A of the module. Each module is thus equipped with two junction boxes 50, each housed in the cutout 20C of a profiled section 20. The junction boxes 50 of a module 10 are linked together and linked to the outside using cables 52 allowing for electrical connection of the module 10, once it has been mounted on the structure 30, with adjacent modules 10 and with devices, not depicted, for making the electrical current available.

Particularly advantageously, the two reinforcing profiled sections 20 of one module 10 are identical to one another and arranged on the rear face 10A of the module symmetrically with one another with respect to a central axis $X_{10}$ of the module. In particular, as shown by the arrow R in FIG. 3, all that is required is for one profiled section 20 to be rotated by 180° on itself in order for the two profiled sections 20 to be positioned on the face 10A, using a single template of profiled section. This gives the possibility of mass producing the profiled section 20, by cutting and bending steel blanks, and thus of reducing its cost of manufacture. As an alternative, the profiled sections 20 may be made of any material other than steel and suited to their function, particularly of some other metallic material or of a synthetic material, the profiled section in the latter case being obtained by extruding the synthetic material.

Figure 6:
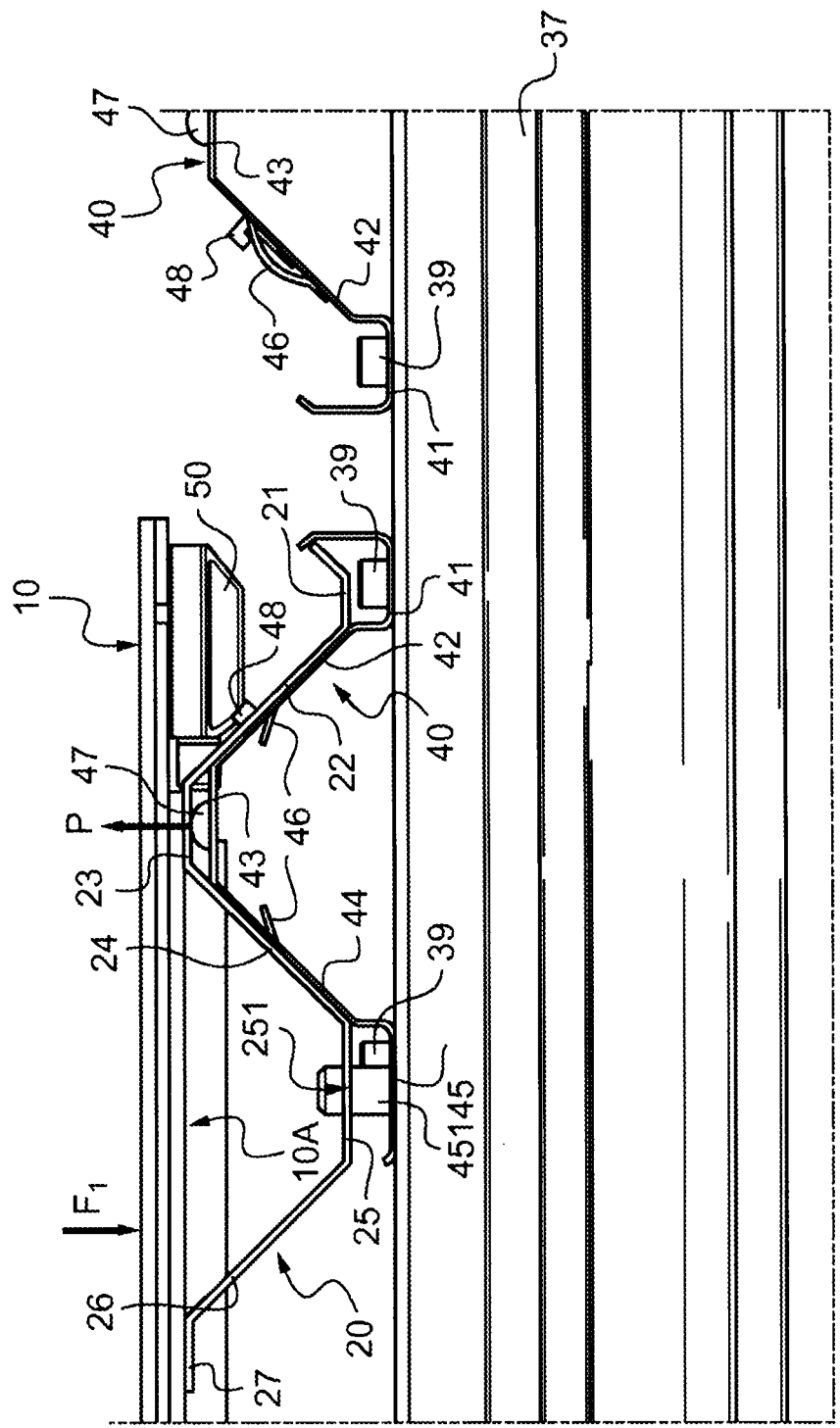
FIG. 6 is a view in section on VI of FIG. 2.

Each support 40 of the attachment device 1 is attached to the corresponding crossmember 37 by means of two screws 39. Each support 40 is made of stainless steel and formed of a single cut and bent blank. The supports 40 are identical to one another and each have a cross section overall in the shape of an omega, comprising two branches 41 and 45 flanking a central part 42-44 of the omega. The central part of the omega has a bottom wall 43 and two side walls 42 and 44 which are oblique with respect to the bottom wall 43. As may be seen in FIG. 6, this central part 42-44 of each support 40 is provided with a U-shaped cross section that substantially complements the U-shaped cross section of the part 22-24 of each profiled section 20. In particular, the part 22-24 of each profiled section 20 of the module is able simultaneously to fit over the central part 42-44 of two supports 40 arranged on two adjacent crossmembers 37, as shown in FIG. 7. The end wall 43 of each support 40 is fitted with elastic end stops 47 intended to have pressing against them the wall 23 of a profiled section 20 fitted over the support.

In order to ensure optimum positioning of a module 10 with respect to the structure 30 with a view to attaching the module to the structure, at least one of the four supports 40 associated with the module is fitted with an alignment peg 451 at its wall 45. This peg 451 is intended to collaborate with a complementary orifice 251 made in the wall 25 of at least one reinforcing profiled section 20 of the module, near the end 20A or 20B of the profiled section. Collaboration between the alignment peg 451 and the corresponding orifice 251, combined with the relative engagement of the U-shaped parts 22-24 of the profiled sections and 42-44 of the supports, provides reliable indexing of the position of the module on the structure prior to their relative immobilization, thus contributing to making the module easier to mount on the structure.

To attach the modules 10 to the structure 30, the lateral wall 42 of each support 40 comprises a tongue intended to collaborate by snap-fastening with a notch 28 formed in the lateral wall 22 of each reinforcing profiled section 20. More specifically, as may be seen in FIG. 2, the lateral wall 22 of each profiled section 20 has two notches 28, each positioned near one end 20A, 20B of the profiled section. Thus, when the part 22-24 of a reinforcing profiled section fits simultaneously over the part 42-44 of two supports 40 arranged on two adjacent crossmembers 37, the tongue 48 of each of the two supports 40 is able to snap-fasten into one of the two notches 28 of the profiled section. In the condition in which a tongue 48 is snap-fastened together with a notch 28, a lower edge 281 of the notch is housed in a groove 49 delimited by the tongue 48 and open toward the structure 30. In this embodiment, attachment of each module 10 to the structure 30 involves snap-fastening the tongues 48 of four supports 40 into four notches 28 distributed in pairs on the two reinforcing profiled sections 20 of the module. In the activated state of the snap-fastening means that these four pairs of tongues and notches 28 constitute, the two reinforcing profiled sections 20 of the module 10 are immobilized with respect to the four supports 40 such that the module 10 is attached to the structure 30.

The lateral wall 42 of each support 40 also comprises, on each side of the tongue 48, two elastic leaves 46 cut from the steel structure of the support 40. Two elastic leaves 46 are also cut from the side wall 44 of each support 40, symmetrically with respect to a mid-plane of the support. The four elastic leaves 46 are able to exert on the walls 22 and 24 of a profiled section 20 fitted over the support 40, a thrust force pushing the profiled section 20 away from the support 40, and therefore pushing the module 10 away from the structure 30, as shown by the arrow P in FIG. 6. The thrust force P applied by the elastic leaves 46 to the reinforcing profiled section 20 allows the snap-fastening means 28 and 48 to be locked in their activated state, holding the edge 281 of the notch 28 in the groove 49.

Aside from the two notches 28, the lateral wall 22 of each reinforcing profiled section 20 of a module 10 also comprises two orifices 29, each situated near one of the notches 28 so that in the configuration in which a tongue 48 is snap-fastened with respect to the notch 28, the orifice 29 faces the tongue 48. Thanks to this arrangement, it is possible to deactivate the snap-fastening means of a module 10 mounted on the structure 30, that is to say to unlock the assembly. As shown in FIG. 7, such unlocking is obtained by applying both a thrust force $F_2$ pushing the module 10 in the direction of the structure 30, against the action of the elastic pushing P of the leaves 46, and a thrust force $F_3$ pushing each tongue 48 collaborating with a reinforcing profiled section of the module 10 away from the corresponding notch 28. The thrust force $F_3$ is exerted through the orifice 29 adjacent to the notch 28, using any appropriate tool.

A method of mounting photovoltaic modules 10 on the structure 30 by means of the attachment device 1 according to the invention comprises steps such as those described hereinbelow.

First of all, the module 10 is equipped with its two reinforcing profiled sections 20 by bonding the walls 23 and 27 of the reinforcing profiled sections against the face 10A of the module, according to the arrangement shown in FIG. 3.

Supports 40 are also secured to the structure 30, by screw-fastening using screws 39, positioning the supports 40 on the crossmembers 37 of the structure with a suitable spacing corresponding to the spacing between the notches 28 of the reinforcing profiled sections 20.

Each module 10 is then mounted on the structure 30 as follows. First of all, the snap-fastening means 28 and are aligned with one another. To do this, the U-shaped central part 42-44 of two supports 40 arranged on two adjacent crossmembers 37 are engaged inside the corresponding U-shaped part 22-24 of each of the two reinforcing profiled sections 20 of the module 10. In so doing, the alignment peg 451 provided on at least one of the four supports 40 associated with the module is also introduced into the corresponding orifice 251 of at least one reinforcing profiled section 20 of the module 10. On completion of this step, the tongues and notches 28 that form snap-fastening means are aligned in pairs. A one-way thrust force $F_1$ that pushes the module 10 in the direction of the structure 30 is then applied in such a way as to activate the snap-fastening means, that is to say to snap-fasten the tongue 48 of each of the four supports 40 associated with the module in the notch 28 which is aligned with the tongue.

Advantageously, the step of securing the profiled sections 20 to the modules 10 may be carried out on the site on which the modules 10 are manufactured, whereas the next steps are performed on the site on which the modules 10 are mounted.

Should it be necessary to remove or replace a module 10 mounted on the structure 30, for example should this module become defective, removal of the module 10 can be performed in a particularly simple way, by simultaneously applying a thrust force $F_2$ pushing the module 10 in the direction of the structure 30, against the action of the elastic pushing P of the leaves 46, and a thrust force $F_3$ pushing each tongue 48 collaborating with a reinforcing profiled section of the module 10 away from the corresponding notch 28, through the orifice 29 adjacent to the notch 28.

As is evident from the embodiment described hereinabove, the attachment device according to the invention allows quick and easy mounting of solar modules on a structure, such as a mounting structure of a ground-mounted system, by applying a one-way thrust force $F_1$ to each module already positioned on the structure, without the need for special tooling. This thrust force actuates the snap-fastening of reinforcing profiled sections of the module with respect to supports secured to the structure. Positioning the module on the structure for prealignment of the snap-fastening means of the supports with respect to the reinforcing profiled sections is also easy, particularly thanks to the complementary shape of certain parts 22-24 and 42-44 of the reinforcing profiled sections 20 and of the supports 40.

Thanks to the elastic action of the locking means 46, which keep the snap-fastening means in an activated state, the attachment obtained of the modules to the structure is reliable and robust. In addition, the elements that make up the attachment device according to the invention, namely the reinforcing profiled sections 20 and the supports 40, have the advantage that they can be manufactured simply and economically by cutting and bending steel blanks, so as to define the snap-fastening and locking means. Furthermore, assembly of the modules with the structure as obtained according to the invention is reversible, thanks to the presence of the unlocking orifices 29 which allow one module to be removed individually from the structure should this module become defective.

Furthermore, the presence of the reinforcing profiled sections 20 of elongate shape, evenly distributed at the rear of each module, improves the mechanical strength of the modules and, in as much as there is no longer any need to have a frame around the periphery of the module in order to secure it to a structure, the entire active surface of the module is exposed to solar radiation, ensuring optimal efficiency of the module.

The invention is not restricted to the examples described and depicted. In particular, the attachment device according to the invention may involve snap-fastening members other than tongues and notches, or alternatively may involve a number of notches and of tongues other than the number described hereinabove. The number and shape of the reinforcing profiled sections 20 associated with each module may also differ from those described hereinabove, the reinforcing profiled sections advantageously being evenly distributed over the face 10A of the module so as to reinforce the structure of the module. In addition, the attachment device according to the invention may be implemented for mounting on a structure modules which may or may not be fitted with peripheral frames, the frameless option nonetheless being preferred. The attachment device according to the invention may also be used for mounting solar modules of any type on a mounting structure likewise of any type. In particular, the photovoltaic solar modules described hereinabove may be replaced by thermal solar modules or hybrid photovoltaic/thermal modules, and the mounting structure may be a mounting structure of a ground-mounted system, a roof or a façade.

The invention claimed is:

1. A method of mounting at least one module for collecting energy originating from solar radiation on a structure, in which the module includes on its rear face at least one reinforcing profiled section, by an attachment device comprising at least one support secured to the structure, the support comprising snap-fastening means with respect to the reinforcing profiled section of the module, the method comprising:

securing the at least one support to the structure;
   obtaining alignment of the snap-fastening means of the support with respect to the reinforcing profiled section; and
   activating the snap-fastening means by applying a one-way thrust force pushing the module toward the structure,
   wherein the reinforcing profiled section extends substantially the length of the module, and
   wherein the reinforcing profiled section is present on the rear face of the module prior to the activating the snap-fastening means.

2. A method according to claim 1, wherein the structure is a roof, or a façade, or a mounting structure of a ground-mounted system.

3. A method according to claim 1, further comprising:
   locking the snap-fastening means in an activated state by an elastic means of the support that pushes the module away from the structure.

4. A method according to claim 3, wherein the elastic means includes at least one elastic leaf configured to push the module away from the structure to lock the snap-fastening means in the activated state.

5. An attachment device for attaching a module for collecting energy originating from solar radiation to a structure, the module including on its rear face at least one reinforcing profiled section, the device comprising:
   at least one support secured to the structure, the support comprising snap-fastening means with respect to the reinforcing profiled section of the module, and the snap-fastening means can be activated by applying a one-way thrust force pushing the module toward the structure, wherein the reinforcing profiled section extends substantially the length of the module, and wherein the reinforcing profiled section is present on the rear face of the module prior to being snap-fastened to the support.

6. An attachment device according to claim 5, wherein the structure is a roof, or a façade, or a mounting structure of a ground-mounted system.

7. An attachment device according to claim 5, wherein the support comprises, for locking the snap-fastening means in an activated state, elastic means for pushing the module away from the structure.

8. An attachment device according to claim 5, wherein the snap-fastening means comprises at least one tongue of the support configured to collaborate by snap-fastening with a notch of the reinforcing profiled section.

9. An attachment device according to claim 8, wherein the tongue defines a groove for accommodating an edge of the notch, this groove being open toward the structure.

10. An attachment device according to claim 9, further comprising, as locking means for locking the snap-fastening means in an activated state, elastic thrust means for pushing the module away from the structure so as to keep the edge inside the groove.

11. An attachment device according to claim 10, wherein the reinforcing profiled section comprises an unlocking orifice which, when the snap-fastening means is in the activated state, faces the tongue, the snap-fastening means being configured to change from the activated state to a deactivated state under a combined effect of a thrust force pushing the module toward the structure against action of the elastic means and of a thrust force pushing the tongue away from the notch and applied through the unlocking orifice.

12. An attachment device according to claim 5, wherein the reinforcing profiled section comprises at least one part with a U-shaped cross section substantially complementing a U-shaped cross section of a part of the support, the U-shaped parts being engaged in one another when the snap-fastening means is in the activated state.

13. An attachment device according to claim 5, further comprising at least one peg secured to one of either the reinforcing profiled section or the support, the peg being configured to collaborate with an orifice in the other of either the reinforcing profiled section or the support to align the snap-fastening means of the support with respect to the reinforcing profile section.

14. An attachment device according to claim 5, wherein the support is a metal blank which has been cut and bent to form the snap-fastening means.

15. An attachment device according to claim 5, wherein the reinforcing profiled section is inwardly offset with respect to peripheral edges of the module.

16. An attachment device according to claim 5, wherein the reinforcing profiled section of the module is of elongate shape and is configured to collaborate by snap-fastening with a support at each of its ends.

17. An attachment device according to claim 5, wherein the module comprises at least two reinforcing profiled sections secured to its rear face and evenly distributed over the rear face.

18. An attachment device according to claim 5, wherein the module is a frameless photovoltaic module, which comprises a front substrate, a rear substrate, and at least one photovoltaic cell inserted between the front and rear substrates, the or each reinforcing profiled section being secured to a rear face of the rear substrate which is the opposite face to the photovoltaic cell.

19. An attachment device according to claim 7, wherein the elastic means includes at least one elastic leaf configured to push the module away from the structure to lock the snap-fastening means in the activated state.

\* \* \* \* \*